United States Patent [19]

Nagatsuma et al.

[11] Patent Number: 4,631,402
[45] Date of Patent: Dec. 23, 1986

[54] OPTICAL ELECTRIC-FIELD MEASURING APPARATUS

[75] Inventors: Kazuyuki Nagatsuma, Hachioji; Kazumasa Takagi, Tokyo; Hiroyoshi Matsumura, Saitama, all of Japan

[73] Assignees: Hitachi, Ltd.; Hitachi Cable, Ltd., both of Tokyo, Japan

[21] Appl. No.: 575,783

[22] Filed: Feb. 1, 1984

[30] Foreign Application Priority Data

Feb. 10, 1983 [JP] Japan .................................. 58-19822

[51] Int. Cl.$^4$ ............................................ G01D 5/34
[52] U.S. Cl. .................................... 250/231 R; 324/96
[58] Field of Search ........................ 324/96; 350/396; 250/231 R

[56] References Cited

FOREIGN PATENT DOCUMENTS 0083196 7/1983 European Pat. Off. ............. 324/96
2068137 8/1981 United Kingdom ................. 324/96

Primary Examiner—David C. Nelms
Assistant Examiner—Stephone Allen
Attorney, Agent, or Firm—Antonelli, Terry & Wands

[57] ABSTRACT

An apparatus for measuring electric field by making use of electrooptic effect includes an electrooptical crystal having a crystallographically eulytite structure such as $Bi_4Ge_3O_{12}$, $Bi_4Si_3O_{12}$ or $Bi_4(Ge, Si)_3O_{12}$ as a material with electrooptic effect. The optical electric-field measuring apparatus has an increased measuring sensitivity and a stabilized temperature characteristic and scarcely disturbs the distribution of electric field to be measured.

15 Claims, 11 Drawing Figures

A DIRECTION OF ELECTRIC
FIELD IS PARALLEL OR
PERPENDICULAR TO AN OPTICAL AXIS

A DIRECTION OF ELECTRIC
FIELD IS PARALLEL OR
PERPENDICULAR TO AN OPTICAL AXIS

OPTICAL ELECTRIC-FIELD MEASURING APPARATUS

The present invention in general relates to an apparatus for measuring electric field by making use of electrooptic effect. More particularly, the invention concerns such optical electric-field measuring apparatus which is improved in respect to the temperature characteristic and exhibits a high measuring sensitivity.

As the material with electrooptic effect for the electric-field measuring apparatus of which operation is based on the electrooptic effect (Pockels effect), there have heretofore been employed electrooptical crystals such as, for example, KDP ($KH_2PO_4$), ADP ($NH_4H_2PO_4$), $LiNbO_3$, $LiTaO_3$ and the like. However, the optical electric-field measuring apparatus in which the electrooptical crystal mentioned above is used is poor in the temperature characteristic. Recently, it has been proposed to use a single crystal of $Bi_{12}SiO_{20}$ or $Bi_{12}GeO_{20}$ in place of the afore-mentioned electrooptical crystal with a view to improving the temperature characteristic of the electric-field measuring apparatus (refer to Japanese Patent Application Laid-Open No. 100364/1981). However, the single crystal of $Bi_{12}SiO_{20}$ or $Bi_{12}GeO_{20}$ exhibits optical activity (rotatory polarization; property that polarization plane is rotated when linearly polarized light is transmitted) in addition to the electrooptical effect (Pockels effect), as the result of which the electrooptical effect is cancelled out by the optical activity when the length of the sensor element is increased. Thus, the attempt for improving the electrooptical effect by increasing the length of the electric-field sensing element is rendered impractical. Further, the proposed single crystal has a high relative dielectric constant of the order of 40 to 60, suffering from low detection sensitivity and providing a problem that difficulty is encountered particularly in the measurement of the electric field of low intensity. Besides, the high relative dielectric constant gives rise to another problem that distribution of the electric field to be measured is disturbed, to make it difficult to measure the electric field of the proper distribution.

The following references are cited to show the state of the art:
(i) Japanese Patent Application Laid-Open No. 128770/1979,
(ii) Japanese Patent Application Laid-Open No. 67764/1981, and
(iii) Japanese Patent Application Laid-Open No. 100364/1981.

It is therefore an object of the present invention to provide an optical electric-field measuring apparatus which exhibits a high sensitivity for measurement of electric field as well as improved temperature characteristic and which is capable of measuring the electric field without disturbing distribution thereof.

In view of the object mentioned above, there is provided according to an aspect of the present invention an optical electric-field measuring apparatus in which an electrooptic crystal having a crystallographically eulytite structure such as $Bi_4Ge_3O_{12}$, $Bi_4Si_3O_{12}$, $Bi_4(Ge, Si)_3O_{12}$ or the like is employed as the material exhibiting the electrooptical effect.

The crystal structure of $Bi_{12}SiO_{20}$ and $Bi_{12}GeO_{20}$ employed heretofore belongs to the point group 23 of 32 kinds of symmetry classes and both have as high an optical activity as ca. 10 deg/mm. On the other hand, the electrooptical crystal having the crystallographically eulytite structure such as $Bi_4Si_3O_{12}$, $Bi_4Ge_3O_{12}$ and the like employed according to the teaching of the invention belongs to the point group $\overline{4}3$ m and exhibits no optical activity. In contrast to the high relative dielectric constant on the order of 56 and 40 of $Bi_{12}SiO_{20}$ and $Bi_{12}GeO_{20}$, respectively, that of $Bi_4Ge_3O_{12}$ is about 16 which is about 1/3.5 and 1/2.5 of the relative dielectric constants of $Bi_{12}SiO_{20}$ and $Bi_{12}GeO_{20}$, respectively. It can be said that $Bi_4Si_3O_{12}$ and other electrooptical crystals of the crystallographically eulytite structure have the relative dielectric constant of the substantially same order as $Bi_4Ge_3O_{12}$.

There are listed in the following Table 1 refractive indices $n_0$, Pockels constant $\gamma_{41}$, relative dielectric constant $\epsilon$ and optical activity (rotatory polarization) $\theta$ for the four kinds of single-crystals mentioned above.

TABLE 1

| | $n_0$ | $\gamma_{41}(\cdot 10^{-12} m/V)$ | $\epsilon$ | $\theta$ (deg/mm) |
|---|---|---|---|---|
| $Bi_{12}SiO_{20}$ | 2.45 | 4.4 | 56 | 10.5 |
| $Bi_{12}GeO_{20}$ | 2.45 | 3.2 | 40 | 10.2 |
| $Bi_4Si_3O_{12}$ | 2.00 | 0.55 | — | 0 |
| $Bi_4Ge_3O_{12}$ | 2.06 | 1.0 | 16 | 0 |

The optical electric-field measuring apparatus according to the present invention is improved in respect to the temperature characteristic, exhibits a high measuring sensitivity and is capable of measuring electric field without disturbing the distribution thereof by virtue of the fact that the electrooptical crystal of the properties mentioned above is used as the material for producing the desired electrooptical effect.

The present invention will be apparent from the following detailed description taken in conjunction with the accompanying drawings, in which.

Now, the invention will be described in more detail.

The optical electric-field measuring apparatus according to the invention comprises a light source part, an electric-field sensing part incorporating a material exhibiting the electrooptical effect for causing intensity of light emitted by the light source part to be varied in dependence on the intensity of electric field, a measuring part for measuring the intensity of light output from the electric-field sensing part, and optical fibers for optically coupling the light source part, the electric-field sensing part and the measuring part to one another, wherein an electrooptical crystal having the crystallographically eulytite structure is used as the material exhibiting the electrooptical effect.

With the above structure of the optical electric-field measuring apparatus according to the invention, excellent performances such as improved or stabilized temperature characteristic, increased measuring sensitivity and capability of measuring the electric field without disturbing the distribution thereof can be realized by virtue of the feature that the electrooptical crystal of crystallographically eulytite structure which has a good temperature characteristic, exhibits no optical activity (rotatory polarization) and has low relative dielectric constant is employed as the material exhibiting the electrooptical effect (Pockels effect).

For the electrooptical crystal of crystallographically eulytite structure, there may be mentioned, for example, $Bi_4Ge_3O_{12}$, $Bi_4Si_3O_{12}$ and $Bi_4(Ge, Si)_3O_{12}$.

In the optical electric-field measuring apparatus according to the present invention, the most desirable effect can be accomplished when the length l of the electrooptical crystal element employed in the inventive apparatus as measured in the direction in which light travels or propagates is selected not less than the element length (hereinafter represented by L) at which the degree of modulation can be attained which is same as the one obtained when heretofore known electrooptical crystal of the crystal structure belonging to the point group 23 and having the element length l is employed.

According to an embodiment of the present invention, the use of the single electrooptical crystal element of the length not less than L may be replaced by such arrangement in which a plurality of the electrooptical crystal elements each of a length shorter than the above defined length L are disposed or arrayed in the light traveling direction so that sum of the individual element lengths in the light traveling direction amounts to a length which is not shorter than the above defined length L. In this connection, the array may include at least one electrooptical crystal element of the length equal to or greater than L to thereby increase the overall optical path and hence the measuring sensitivity.

According to still another embodiment of the invention, such arrangement may be adopted in which light is caused to travel reciprocatingly at least once within the electrooptical crystal so that the length of the effective optical path extending through the electrooptical crystal is not shorter than the above defined length L.

It can thus be said that the optical electric-field measuring apparatus according to the present invention will assure the most advantageous or desirable performances when the overall length of the effective optical path realized in the electrooptical crystal having the crystallographically eulytite structure is not shorter than L. In case the overall length of the effective optical path in the electrooptical crystal is short of L, the measuring sensitivity will remain unimproved over that of the hitherto known optical electric-field measuring apparatus in which the electrooptical crystal belonging to the point group 23 is employed, although advantage can be obtained in the respect that the electric field to be measured is prevented from disturbance.

In the following, the optical electric-field measuring apparatus will be considered from the theoritical viewpoint. At first, description will be made of expressions representative of basic relationships relevant to the optical electric-field measuring apparatus. As a factor for determining comparatively the electric-field detecting sensitivity of the electric-field sensing element, the ratio of signal output to quiescent output of the sensor element which is placed between a pair of electrode plates disposed in opposition with a considerably great distance therebetween as compared with the length of the sensor element is defined as the degree of modulation or modulation degree.

Figure 1:
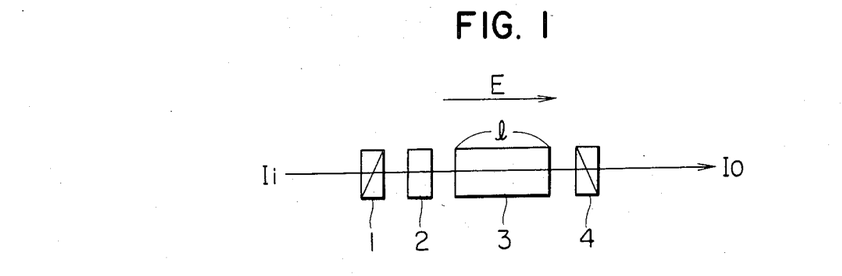
FIG. 1 is a view showing schematically a basic structure of an optical electric-field measuring apparatus operative on the basis of logitudinal modulation principle.

In the first place, the electric-field measuring apparatus of the logitudinal modulation type in which light travels in the direction in which the electric field is applied will be considered by referring to FIG. 1 which shows a basic structure of the longitudinal modulation type electric-field measuring apparatus and in which E represents the direction of the applied electric field. In this figure, a reference numeral 1 denotes a polarizer, 2 denotes a quarter-wave ($\lambda \cdot \frac{1}{4}$) plate, 3 denotes the electric-field sensing element (electrooptical crystal element), and 4 denotes an analyzer. When the length of the sensor element 3 as measured in the light traveling direction (i.e. in the direction in which the electric field is applied in the case of the instant example) is represented by l, while intensity of externally applied electric field is represented by $E_0$ with the wavelength of used light within the free space being represented by $\lambda$, the voltage V appearing across the sensor element 3 is approximately given by the following expression:

$$V = \frac{l}{\epsilon} E_0 \qquad (1)$$

A voltage $V_\pi$ required for light passing through the sensor element to change the phase by $\pi$ (this voltage is referred to as the half wavelength voltage) is given by $$V_\pi = \frac{\lambda}{2n_0^3 \gamma_{41}} \qquad (2)$$

where $\epsilon$, $n_0$ and $\gamma_{41}$ represent the relative dielectric constant, refractive index and Pockels constant of the sensor element 3. Referring to FIG. 1, circularly polarized light is produced through cooperation of the polarizer 1 and the quarter wavelength plate 2 and inputted to the electric-field sensing element 3. By optimizing the crystalline orientation of the electric-field sensing element 3 and the direction of polarization of the analyzer 4, the output light intensity $I_0$ in response to input light $I_i$ is given by $$I_0 = \frac{I_i}{2}\left(1 + \frac{\pi V}{V_\pi} \cdot \frac{\sin g}{g}\right) \quad (3)$$

where $$g = \sqrt{\left(\frac{\pi V}{V_\pi}\right)^2 + (2\theta l)^2} \quad (4)$$

and $\theta$ represents the optical activity (rotatory polarization).

As defined hereinbefore, the modulation degree m is given in terms of the ratio between the quiescent output $(I_0)_0$ and the signal output $(I_0)_s$ as follows:

$$m = \frac{\pi V}{V_\pi} \cdot \frac{\sin g}{g} \quad (5)$$

$$= \frac{2\pi n_0^3 \gamma_{41}}{\lambda} \cdot \frac{l}{\epsilon} \cdot E_0 \cdot \frac{\sin g}{g}$$

Figure 2:
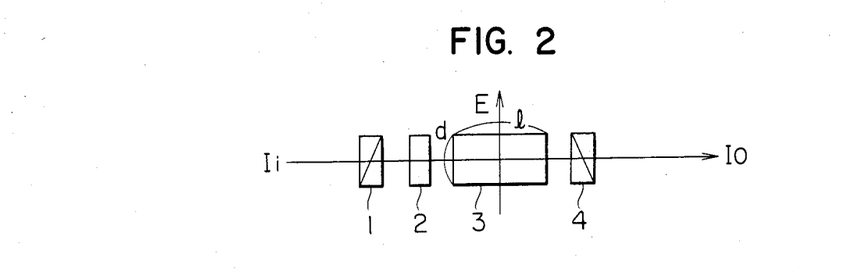
FIG. 2 is a view showing schematically a basic structure of the optical electric-field measuring apparatus operative on the basis of transverse modulation principle.

Next, description will be made of the optical electric-field measuring apparatus of transverse modulation type in which the electric field is applied in the direction perpendicular to the light traveling direction. FIG. 2 shows a basic structure of this type measuring apparatus, wherein the direction in which the electric field is applied is indicated by E. Referring to FIG. 2, when the length of the field sensing element 3 as measured in the direction in which the electric field is applied is represented by d while magnitude of the external electric field is by $E_0$, the voltage appearing across the sensor element 3 is approximately given by $$V = \frac{d}{\epsilon} E_0 \quad (6)$$

The half wavelength voltage $V_\pi$ in the case of the optical electric-field measuring apparatus of the tranverse modulation type is given by $$V_\pi = \frac{\lambda}{2n_0^3 \gamma_{41}} \cdot \frac{d}{l} \quad (7)$$

In the transverse modulation type apparatus, the expressions (3) and (4) also apply valid on the optimized condition as in the case of the longitudinal modulation type field measuring apparatus described hereinbefore. Thus, from the expressions (6), (7), (3) and (4), the modulation degree or ratio can be arithmetically determined as follows:

$$m = \frac{\pi V}{V_\pi} \cdot \frac{\sin g}{g} \quad (8)$$

$$= \frac{2\pi n_0^3 41}{\lambda} \cdot \frac{l}{\epsilon} \cdot E_0 \cdot \frac{\sin g}{g}$$

The expression (8) coincides with the expression (5), which means that the modulation degree $(V/V_\pi)$ remains same independent of whether the optical electric-field measuring apparatus is of the longitudinal modulation type or of the transverse modulation type.

Here, the numerical values of the terms of $\pi V/V_\pi$ and $2\theta l$ of the expression (4) will be comparatively examined. In the case of the crystal exhibiting no optical activity (rotatory polarization) such as, for example, $Bi_4Ge_3O_{12}$, the term $2\theta l$ assumes the value of zero. Accordingly, the expression (4) will then include only the term $\pi \cdot V/V_\pi$. On this condition, the modulation degree m is given by the following expression independent of the modulation types. Namely, $$m = \sin\left(\frac{2\pi n_0^3 \gamma_{41}}{\lambda} \cdot \frac{l}{\epsilon} \cdot E_0\right) \quad (9)$$

On the other hand, in the case of $Bi_{12}SiO_{20}$ and $Bi_{12}GeO_{20}$, the term $2\theta l$ representing the optical activity assumes the value of about $(20 \times l)$ deg or $(0.35 \times l)$ rad. In the ordinary electric field measurement, $E_0 \leq 10$ kV/mm. In the case of $Bi_{12}SiO_{20}$, the ratio $\pi V/V_\pi$ is calculated to be about $(0.086 \times l)$ rad, when $E_0 = 10$ kV/mm. The ratio of $(\pi V/V_\pi)^2$ and $(2\theta l)^2$ is on the order of 6/100. It is believed that $(\pi V/V_\pi)^2 << (2\theta l)^2$ even at a maximum intensity of electric field to be measured. In the case of $Bi_{12}GeO_{20}$, the value of $(\pi V/V_\pi)$ is smaller as compared with $Bi_{12}SiO_{20}$, permitting better approximation. In this way, when the ordinary electric field of intensity not higher than 10 kV/mm is measured by using $Bi_{12}SiO_{20}$ or $Bi_{12}GeO_{20}$, it is safe to say that $(\pi V/V_\pi)^2 << (2\theta l)^2$. Accordingly, the expression (4) may be rewritten in approximation as follows:

$$g \approx 2\theta l \quad (10)$$

On the condition, from the expressions (10) and (8), the modulation degree m given by $$m = \frac{2\pi n_0^3 \gamma_{41}}{\lambda} \cdot \frac{l}{\epsilon} \cdot E_0 \cdot \frac{\sin(2\theta l)}{2\theta l} \quad (11)$$

applies valid independent of the types of modulation.

Next, the modulation degree m obtained by using $Bi_4Ge_3O_{12}$ will be compared with those attained by using $Bi_{12}SiO_{20}$ and $Bi_{12}GeO_{20}$ with the aid of the expressions (9) and (11). The concrete value of m is calculated by using the numerical data listed in the Table 1 on the assumption that $E = 100$ V/mm and $\lambda = 0.85$ $\mu$m. The results of calculation are graphically illustrated in FIG. 3. As will be seen from the figure, limitation is imposed on the value taken by the modulation degree m even when the length l of the sensor element 3 is increased, because of the optical activity (rotatory polarization) of $Bi_{12}SiO_{20}$ and $Bi_{12}GeO_{20}$. On the other hand, in the case of $Bi_4Ge_3O_{12}$ which exhibits no optical activity (rotatory polarization), the modulation degree m can be increased correspondingly by increasing the length l of the sensor element 3.

Figure 3:
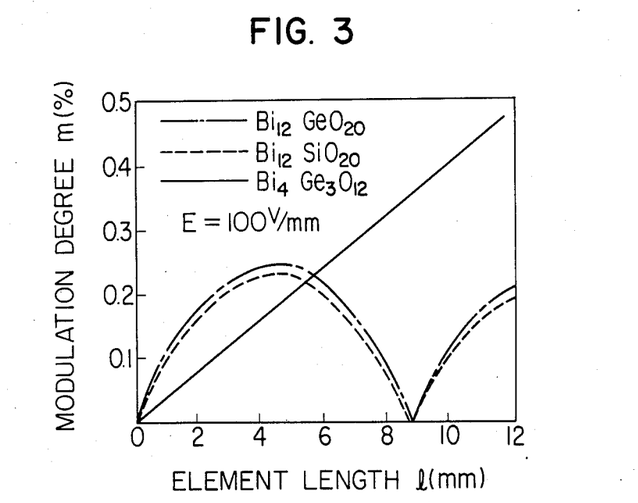
FIG. 3 is a view for graphically illustrating relationships between length of an electric-field sensing element and modulation degree (defined hereinafter) in the optical electric-field measuring apparatus.

Referring to FIG. 3, the lengths l of the sensor element corresponding to intersections of the characteristic curve for $Bi_4Ge_3O_{12}$ with those of $Bi_{12}SiO_{20}$ and $Bi_{12}GeO_{20}$, respectively, i.e. the length l of the sensor element at which the equality of the expressions (9) and (11) applies valid is determined to be 5.34 mm and 5.40 mm, respectively. In other words, when the sensor element of $Bi_4Ge_3O_{12}$ having a length not shorter than the length L which is determined on the condition of equality between the expressions (9) and (11), i.e. (9)=(11), is employed, the modulation degree m which is greater than those attained with the sensor elements of $Bi_{12}SiO_{20}$ and $Bi_{12}GeO_{20}$, respectively, can be obtained regardless of the modulation type as adopted, whereby the sensitivity for the measurement of electric field can be correspondingly increased. In case E=100 V/mm and $\lambda=0.85$ $\mu$m, the length l of the sensor element should be selected equal to or greater than 5.40 mm.

In the foregoing, description has been made by taking $Bi_4Ge_3O_{12}$ as a typical example of the electrooptical crystal having the crystallographically eulytite structure. It is however obvious that the other crystal such as $Bi_4Si_3O_{12}$, $Bi_4(Ge, Si)_3O_{12}$ and the like which exhibit no optical activity can be used as the material for the sensor element 3 to the similar effect.

Figure 10:
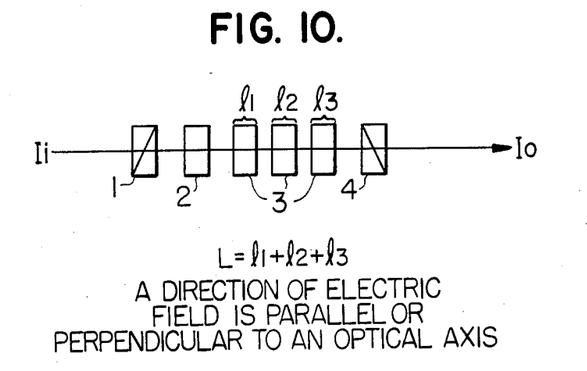
FIG. 10 is a view showing schematically a basic structure of an optical electric-field measuring apparatus operative on the basis of longitudinal or transverse modulation principle having a plurality of sensor elements.

In the foregoing description, it has been assumed that a single sensor element is used whose length as measured in the light traveling direction is selected sufficiently long to increase the sensitivity for the measurement of electric field. As shown in FIG. 10, according to another embodiment of the invention, a plurality of sensor elements 3, of individual lengths $l_1$, $l_2$ and $l_3$, may be prepared and disposed or arrayed in cascade in the light traveling direction to the quite similar advantageous effect as that of the single-element structure described above. When a plurality of sensor elements are employed in this manner, reflective loss produced at the surfaces of the individual sensor elements tends to be increased. Such reflective loss can however be disposed of by appropriate reflection preventing measures. The optical electric-field measuring apparatus which incorporates a plurality of the sensor elements cascaded in the light traveling direction is rather advantageous in that the range of frequency of the detectable electric field is enlarged because the frequency of piezoelectric clamping determined by the size of the sensor element which is small in the case of the instant embodiment is increased. The optical electric-field measuring apparatus in which a plurality of the sensor elements are disposed in the cascade array along the light traveling direction can assure the modulation degree m of a large value to increase the sensitivity for the measurement of electric field as in the case of the single-element structure described hereinbefore, provided that the whole effective optical path defined by the plural sensor elements is selected equal to or longer than the length L determined on the condition of equality of the expressions (9) and (11).

Figure 4:
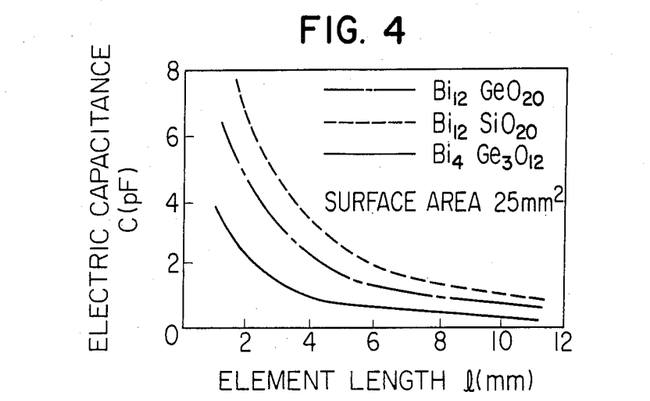
FIG. 4 is a view for graphically illustrating relationship between the element length and electric capacitance in the optical electric-field measuring apparatus of the longitudinal modulation type.
Figure 5:
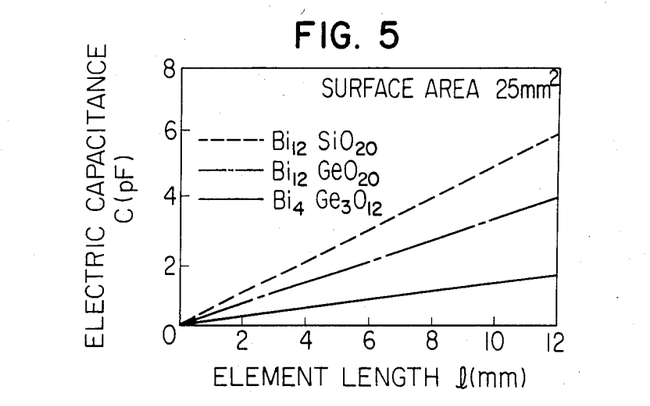
FIG. 5 is a view for graphically illustrating relationships between the element length and electric capacitance in the optical electric-field measuring apparatus of the transverse modulation type.

Next, electrostatic capacity or electric capacitance of the sensor element will be considered. In general, smaller electrostatic capacity is advantageous, because disturbance which distribution of the electric field to be measured undergoes is reduced. In this connection, electric capacitances C of the sensor elements (3) of different crystal materials are calculated by varying the length l of the elements as measured in the light traveling direction on the assumption that the crosssectional area of the sensor element in the direction perpendicular to the light travling direction is of the order of $5\times5$ mm$^2$. The results of calculation are graphically illustrated in FIG. 4 (for the longitudinal modulation type apparatus) and FIG. 5 (for the transverse modulation type apparatus). As is apparent from FIGS. 4 and 5, the sensor element of $Bi_4Ge_3O_{12}$ has smaller electric capacitance C than $Bi_{12}SiO_{20}$ and $Bi_{12}GeO_{20}$ because the relative dielectric constant of the former is as small as 16. The sensor element of $Bi_4Ge_3O_{12}$ having an electric capacitance or electrostatic capacity C which does not exceed 1 pF can thus be realized. In particular, in the case of the optical electric-field measuring apparatus of the longitudinal modulation type, the electric capacitance C of the sensor element can be decreased by increasing the length thereof, to an advantage. In contrast, in the case of the transverse modulation type measuring apparatus, the electric capacitance in concern is correspondingly increased in dependence on the increase in the length of the sensor element, involving a disadvantage. This problem can however be successfully dealt with by an arrangement mentioned below.

Figure 11:
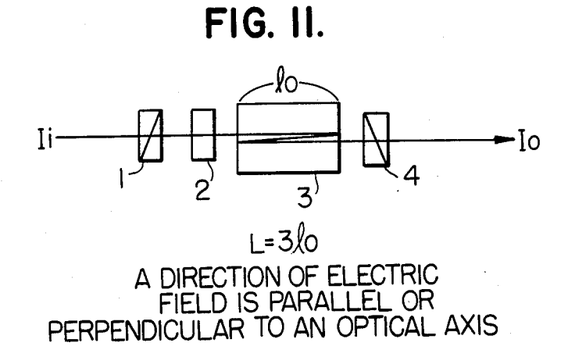
FIG. 11 is a view showing schematically a basic structure of an optical electric-field measuring apparatus operative on the basis of longitudinal or transverse modulation principle wherein the effective optical path is increased by causing light to be reflected within the sensor element.

Namely, arrangement is made such that the length of the effective optical path is increased by causing light to be reflected in multiple within the sensor element while the actual length of the element in the direction perpendicular to the light traveling direction is maintained at a small value. The expressions (6), (7) and (8) applies valid when l represents the effective length of the optical path in the sense mentioned above. In this way, the effective measurement of the electric field can be carried out without increasing the electric capacitance C. Further, with the arrangement in which light is reflected in multiple within the sensor element so that the effective length of the optical path is equal to or greater than the value of L determined on the condition of equality of the expressions (9) and (11), the modulation degree of a greater value can be obtained to increase the sensitivity for the measurement of electric field, as is in the case of the preceding embodiments. For example, in FIG. 11, a crystal of length $l_0$ is shown inclined so that the light is reflected within the crystal such that the effect of length L of the optical path is $3l_0$.

The usefulness of $Bi_4Ge_3O_{12}$ as the material exhibiting the electrooptical effect has been described above from the stand point of the electric capacitance by comparing with $Bi_{12}SiO_{20}$ and $Bi_{12}GeO_{20}$. It will however be appreciated that other electrooptic crystals of crystallographically eulytite structure such as, for example, $Bi_4Si_3O_{12}$, $Bi_4(Ge, Si)_3O_{12}$ and the like are also useful and advantageous in respect to the electric capacitance.

As to the temperature characteristic, the crystal in concern, e.g. $Bi_4Ge_3O_{12}$ and $Bi_4Si_3O_{12}$ and the crystals known as having the desirable temperature characteristic, e.g. $Bi_{12}GeO_{20}$, $Bi_{12}SiO_{20}$ and others all belong to the cubic system although they differ in respect with the point group and exhibit no birefringence. Accordingly, it is safe to say that the temperature characteristic of the crystals of $Bi_4Ge_3O_{12}$, $Bi_4Si_3O_{12}$ and others in concern is as good as that of the known crystals and excellent over $LiNbO_3$, $LiTaO_3$, KDP, ADP and the like which exhibit the birefringence.

EXAMPLE 1

Figure 6:
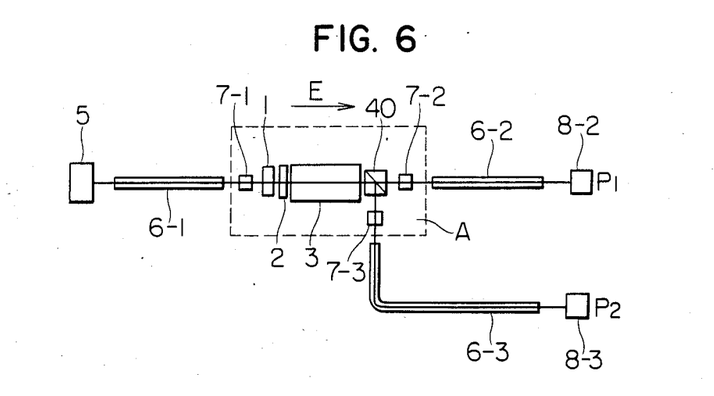
FIG. 6 is a view showing a structure of an optical electric-field measuring apparatus according to an exemplary embodiment of the present invention.

FIG. 6 is a view showing a structure of an optical electric-field measuring apparatus according to the instant exemplary embodiment of the invention. Referring to the figure, a light emission diode having an output power of 60 mW and designed to emit light of wavelength of 0.8 $\mu$m is used as a light source 5. The output light of the light source 5 is introduced into an electric-field sensing unit or part A by way of a clad quartz fiber 6-1 having an outer diameter of 0.6 mm and a lens 7-1 of the electric-field sensing part A. The latter is composed of lenses 7-1, 7-2 and 7-3, a polarizer 1, a quarter wavelength plate 2, an electric-field sensing element (sensor element) 3 and an analyzer (polarized light beam splitter) 40, all the components being housed within a container made of a glass ceramic. In the instant example, one of three rectangular parallelepiped elements formed of a single crystal of $Bi_4Ge_3O_{12}$ having three (100) faces and in sizes of $3\times3\times5$, $3\times3\times10$ and $3\times3\times15$ (all in the unit of mm), respectively, is used as the electric-field sensing element. The direction in which the electric field is applied as well as the light traveling direction is selected lengthwise of the electric-field sensing element. Through the analyzer 40, two linearly polarized components are extracted and introduced to PIN diodes 8-2 and 8-3 by way of the lenses 7-2 and 7-3 and quartz optical fibers 6-2 and 6-3, respectively, to be converted into electric signals $P_1$ and $P_2$. These electric signals $P_1$ and $P_2$ are subsequently synthesized into a signal S by a suitable arithmetic circuit in accordance with $$S = \frac{P_1 - P_2}{P_1 + P_2}$$

The quantity S is in proportion to the modulation degree m described hereinbefore. Through this arithmetic processing, a stable measurement which scarcely undergoes the influence of loss in the transmission path and vibration can be accomplished. An AC electric field of 50 Hz is applied to a maximum value of 40 kV with the aid of parallel plate electrodes each having a diameter of 50 cm and disposed in opposition to each other with a space of 20 cm therebetween.

Figure 7:
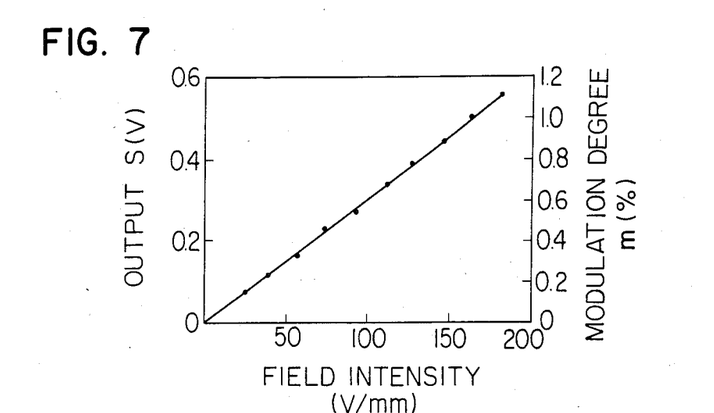
FIG. 7 is a view for graphically illustrating a relationship between applied electric-field and the output of the optical electric-field measuring apparatus according to an embodiment of the invention.
Figure 8:
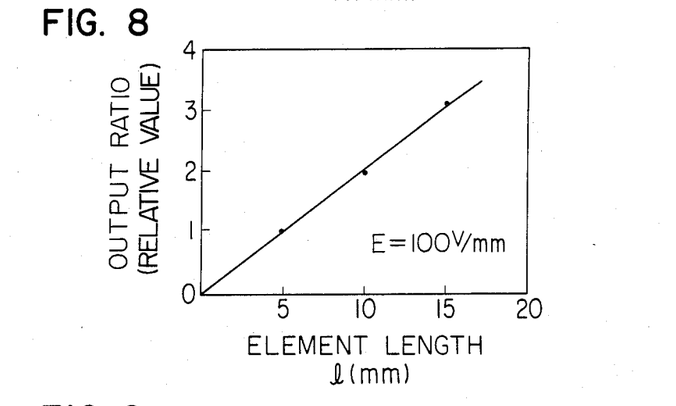
FIG. 8 is a view for graphically illustrating a relationship between the element length and output of the optical electric-field measuring apparatus according to an embodiment of the invention.

FIG. 7 graphically illustrates relationships between the applied electric field and the output S on one hand and between the applied field and the modulation degree m measured on the side of the output signal $P_1$ on the other hand, wherein plotted data have been obtained through measurements effected by using the field sensing element having the length 1 of 10 mm. FIG. 8 shows a relative change in the output S brought about when the length of the field sensing element was changed from 5 mm to 10 mm and thence to 15 mm.

Figure 9:
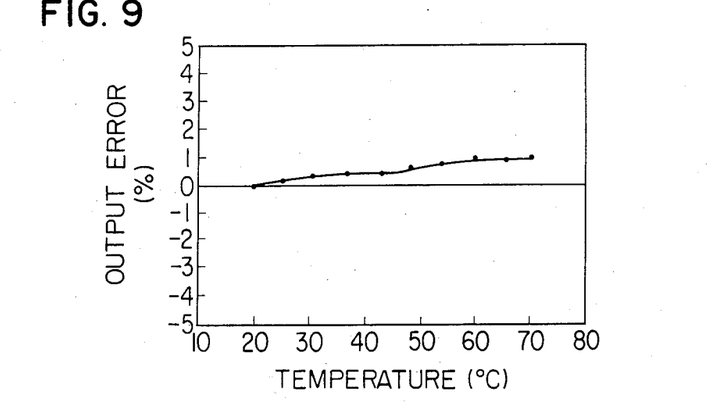
FIG. 9 is a view for graphically illustrating a temperature characteristic of the optical electric-field measuring apparatus according to the invention.

FIG. 7 tells that the output signal of significant magnitude can be obtained for the applied electric field with a good linearity, as it is expected. FIG. 8 tells that the sensitivity for measurement of the electric field can be increased in proportion to the length 1 of the electric field sensing element 3. Further, FIG. 9 shows the results of an experiment for determining the stability of the output signal which was effected by varying the temperature of the electric-field sensing element having the length 1 of 10 mm from 20° to 70° C. under a constant electric field of 100 V/mm. FIG. 9 tells that the temperature characteristic is also preferable.

EXAMPLE 2

The electric field sensing element of $3\times3\times15$ (mm) used in the Example 1 was divided into three sub-elements each of $3\times3\times5$ (mm) which were disposed in alignment with the optical path after polishing the light transmitting faces of the sub-elements so that the overall length of the optical path defined by the arrayed sub-elements was substantially same as the length of the optical path defined by the original integral sensing element. On the condition, the modulation degree was measured in the similar manner as in the case of Example 1. The result of the measurement tells that the modulation degree remains substantially unchanged independent of whether the single integral sensor element or the array of the sub-elements is employed. Further, frequency of the piezoelectric vibration which depends on the length of the field sensing element 3 was examined by measuring the frequency-dependence of the modulation degree for both the cases where the single integral sensor element and the divided element array are employed, respectively. The frequency in concern was about 130 kHz when the single integral sensor element was used. It was acsertained that the frequency increased to ca. 400 kHz in case the divided sensing elements were used.

EXAMPLE 3

An electric-field measuring apparatus of the same structure as that of the Example 1 was fabricated by using a single crystal of $Bi_4Si_3O_{12}$ having crystal faces (110), ($\bar{1}$10) and (001) in a size of $4\times4\times4$ (in mm) as the crystal having the electrooptic effect. The electric field was applied in the direction coinciding with [110]. By inclining the light traveling direction slightly from the direction [$\bar{1}$10] so that light was reflected within the crystal once, twice and thrice, respectively, the modulation degree was measured. It has been found that magnitude of the modulation degree is increased in proportion to the number of reflexions of light taking place within the crystal in spite of the absolute intensity of the light being reduced. The absolute value of the modulation degree measured by causing light to travel two rounds within the crystal under application of the electric field of 100 V/mm was about 0.5% which is substantially same as the result obtained in the Example 1.

EXAMPLE 4

A single crystal of $Bi_4(Ge, Si)_3O_{12}$ in which 5 mol % of Si was substituted for by Ge was prepared and experiment similar to that of Example 2 was performed. Results equivalent to or exceeding over $Bi_4Si_3O_{12}$ were obtained.

From the foregoing description, it will be appreciated that the present invention has now provided an optical electric-field measuring apparatus which exhibits an increased measuring sensitivity and a stabilized temperature characteristic and allows the measurement of electric field to be effected without disturbing the distribution of electric field.

Obviously many modifications and variations of the present invention are possible in the light of the above teachings. It is therefore to be understood that within the scope of the appended claims the invention may be practiced otherwise than as specifically described.

We claim:

1. An optical electric-field measuring apparatus, comprising a light source part, an electric-field sensing part including a material with electrooptic effect for varying intensity of light produced by said light source part in correspondence with intensity of an electric field to be measured, a measuring part for measuring intensity of light output from said electric-field sensing part, and light transmission paths for optically coupling said light source part, said electric-field sensing part and said measuring part, wherein at least one electrooptical crystal element arrayed along the light traveling direction having a crystallographically eulytite structure and belonging to a point group $\bar{4}3$ m is used as said material with electrooptic effect, and wherein said at least one electrooptic crystal element having a crystallographically eulytite structure and belonging to a point group $\bar{4}3m$ has an effective whole length within said at least one electrooptic crystal as measured in the light traveling direction that is greater than a common length at which the same modulation degree is produced when using an electrooptical crystal having a crystallographically eulytite structure and belonging to a point group $\bar{4}3m$ and when using an electrooptical crystal belonging to point group 23.

2. An optical electric-field measuring apparatus according to claim 1, wherein said electric-field sensing part includes a plurality of said electrooptical crystal elements arrayed along the light traveling direction.

3. An optical electric-field measuring apparatus according to claim 1, wherein light supplied from said light source travels reciprocatingly at least once within said at least one electrooptical crystal element.

4. An optical electric-field measuring apparatus according to claim 1, wherein said at least one electrooptical crystal element having a crystallographically eulytite structure is at least one selected from the group consisting of $Bi_4Ge_3O_{12}$, $Bi_4Si_3O_{12}$ and $Bi_4(Ge, Si)_3O_{12}$.

5. An optical electric-field measuring apparatus according to claim 1, wherein the whole length of the effective optical path within said electrooptical crystal is at least equal to 5.4 mm.

6. An optical electric-field measuring apparatus according to claim 1, wherein a direction of said electric field is parallel to said light traveling direction.

7. An optical electric-field measuring apparatus according to claim 2, wherein a direction of said electric field is parallel to said light traveling direction.

8. An optical electric-field measuring apparatus according to claim 3, wherein a direction of said electric field is parallel to said light traveling direction.

9. An optical electric-field measuring apparatus according to claim 4, wherein a direction of said electric field is parallel to said light traveling direction.

10. An optical electric-field measuring apparatus according to claim 5, wherein a direction of said electric field is parallel to said light traveling direction.

11. An optical electric-field measuring apparatus according to claim 1, wherein a direction of said electric field is perpendicular to said light traveling direction.

12. An optical electric-field measuring apparatus according to claim 2, wherein a direction of said electric field is perpendicular to said light traveling direction.

13. An optical electric-field measuring apparatus according to claim 3, wherein a direction of said electric field is perpendicular to said light traveling direction.

14. An optical electric-field measuring apparatus according to claim 4, wherein a direction of said electric field is perpendicular to said light traveling direction.

15. An optical electric-field measuring apparatus according to claim 5, wherein a direction of said electric field is perpendicular to said light traveling direction.

* * * * *